United States Patent
Kim et al.

(10) Patent No.: US 11,262,648 B2
(45) Date of Patent: Mar. 1, 2022

(54) PELLICLE FOR PHOTOMASK AND METHOD OF FABRICATING THE SAME

(71) Applicant: Samsung Electronics Co., Ltd., Suwon-si (KR)

(72) Inventors: Mun Ja Kim, Hwaseong-si (KR); Changyoung Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/940,590

(22) Filed: Jul. 28, 2020

(65) Prior Publication Data

US 2020/0355995 A1 Nov. 12, 2020

Related U.S. Application Data

(62) Division of application No. 16/214,781, filed on Dec. 10, 2018, now Pat. No. 10,809,614.

(30) Foreign Application Priority Data

Jun. 15, 2018 (KR) .................. 10-2018-0069205

(51) Int. Cl.
*G03F 1/62* (2012.01)

(52) U.S. Cl.
CPC ..................... *G03F 1/62* (2013.01)

(58) Field of Classification Search
CPC ..... G03F 1/62; G03F 1/48; G03F 1/22; G03F 1/66
See application file for complete search history.

(56) References Cited

U.S. PATENT DOCUMENTS

| | | | |
|---|---|---|---|
| 9,360,749 B2 | 6/2016 | Lin et al. | |
| 9,395,630 B2 | 7/2016 | Yakunin et al. | |
| 9,703,187 B2 | 7/2017 | Ono et al. | |
| 2010/0189662 A1 | 7/2010 | Neubourg | |
| 2011/0305734 A1 | 12/2011 | Edelson et al. | |
| 2016/0074476 A1 | 3/2016 | Santa Maria et al. | |
| 2017/0038675 A1* | 2/2017 | Ahn .................. | G03F 1/62 |
| 2018/0149966 A1 | 5/2018 | Shin et al. | |

(Continued)

FOREIGN PATENT DOCUMENTS

| KR | 10-2010-0050443 A | 5/2010 |
|---|---|---|
| KR | 10-1506892 B1 | 3/2015 |
| KR | 10-2016-0013063 A | 2/2016 |

(Continued)

OTHER PUBLICATIONS

Wiley, "EUV Pellicle Progress and Strategy," IEUVI Mask TWG, (2013).

(Continued)

*Primary Examiner* — Stewart A Fraser
(74) *Attorney, Agent, or Firm* — Harness, Dickey & Pierce, P.L.C.

(57) ABSTRACT

A pellicle for a photomask comprises a pellicle membrane. The pellicle membrane incudes a base layer having a first surface and a second surface facing the first surface, and a first recovery layer covering the first surface of the base layer. A content of SP2 covalent bonds between carbon atoms contained in the first recovery layer is less than or equal to a content of SP2 covalent bonds between carbon atoms contained in the base layer.

7 Claims, 26 Drawing Sheets

(56) References Cited

U.S. PATENT DOCUMENTS

2018/0259844 A1    9/2018   Shin et al.

FOREIGN PATENT DOCUMENTS

| KR | 10-1600397 B1 | 3/2016 |
| KR | 10-2017-0016013 A | 2/2017 |
| KR | 10-2017-0067662 A | 6/2017 |
| KR | 10-2017-0115556 A | 10/2017 |
| KR | 101792409 B1 | 11/2017 |
| KR | 101813186 B1 | 12/2017 |
| KR | 10-2018-0021217 A | 2/2018 |
| WO | WO-2011/160861 A1 | 12/2011 |

OTHER PUBLICATIONS

Zwol, et al. "Pellicle films supporting the ramp to HVM with EUV," SPIE, vol. 10451 pp. 104510o-1-104510o-9 (2017).

Kim, et al. "Large-scale freestanding nanometer-thick graphite pellicles for mass production of nanodevices beyond 10nm," Nanoscale, pp. 1-4 (2015).

Filleter, et al. "Ultrahigh Strength and Stiffness in Cross-Linked Hierarchical Carbon Nanotube Bundles," Advanced Materials, vol. 23, pp. 2855-2860 (2011).

Jung, et al. "Ultraconformal Contact Transfer of Monolayer Graphene on Metal to Varios Substrates," Advanced Materials, pp. 1-7 (2014).

Goldfarb, "Fabrication of a full size EUV pellicle based on silicon nitride," Photomask, Proc. SPIE, vol. 31, issue 12, pp. 1-13, (2015).

\* cited by examiner

PELLICLE FOR PHOTOMASK AND METHOD OF FABRICATING THE SAME

CROSS-REFERENCE TO RELATED APPLICATION

This U.S. nonprovisional application is a divisional of U.S. application Ser. No. 16/214,781, filed on Dec. 10, 2018, which claims priority under 35 U.S.C § 119 to Korean Patent Application No. 10-2018-0069205 filed on Jun. 15, 2018 in the Korean Intellectual Property Office, the entire contents of each of which are hereby incorporated by reference.

BACKGROUND

Inventive concepts relate to pellicles for photomasks and/or methods of fabricating the same.

A pellicle for a photomask may be provided in the form of a film on a photomask to protect the photomask from external contaminants (e.g., dust, resist, and/or the like) during optical/EUV lithography. A pellicle for a photomask should have high transmittance with respect to light used in a lithography process and other features such as heat radiation, strength, uniformity, durability, and stability. As line widths of semiconductor devices and electronic circuits have been reduced, a wavelength of light used for the lithography process becomes shorter and development of a suitable pellicle material based on a light source used for the lithography process is being pursued.

SUMMARY

Some example embodiments of inventive concepts provide pellicles for photomasks, the pellicles having superior optical characteristics, durability, and mechanical strength.

Some example embodiments of inventive concepts provide methods of fabricating pellicles for photomasks, the pellicles having superior optical characteristics, durability, and mechanical strength.

According to some example embodiments of inventive concepts, a pellicle for a photomask comprises a pellicle membrane. The pellicle membrane incudes a base layer having a first surface and a second surface facing the first surface, and a first recovery layer covering the first surface of the base layer. A content of SP2 covalent bonds between carbon atoms contained in the first recovery layer is less than or equal to a content of SP2 covalent bonds between carbon atoms contained in the base layer.

According to some example embodiments of inventive concepts, method of fabricating a pellicle for a photomask includes providing a pellicle membrane and transcribing the pellicle membrane onto a frame. Providing the pellicle membrane includes forming a base layer having a first surface and a second surface facing the first surface, coating a first carbon-containing material on the first surface of the base layer, and performing a first heat treatment process at a first process temperature to form a first recovery layer that is bonded to the base layer. The first carbon-containing material includes catecholamine.

According to some example embodiments of inventive concepts, a pellicle for a photomask, the pellicle comprises a pellicle membrane. The pellicle membrane includes a base layer that has a first surface and a second surface facing the first surface, a first recovery layer that covers the first surface of the base layer, and a support layer that covers the second surface of the base layer. Each of the base layer, the first recovery layer, and the support layer contain carbon atoms. A content of SP2 covalent bonds between the carbon atoms contained in the first recovery layer is less than or equal to a content of SP2 covalent bonds between the carbon atoms contained in the base layer.

DETAILED DESCRIPTION OF EXAMPLE EMBODIMENTS

Some example embodiments of inventive concepts will now be described in detail with reference to the accompanying drawings to aid in clearly explaining inventive concepts.

When numerical values or equalities are used herein without any further modification, it is intended that the associated numerical value include a tolerance, e.g. an engineering tolerance, around the stated numerical value or equality that is known to one of ordinary skill in the art. When ranges are specified, the range includes all values therebetween such as increments of 0.1%.

Figure 1:
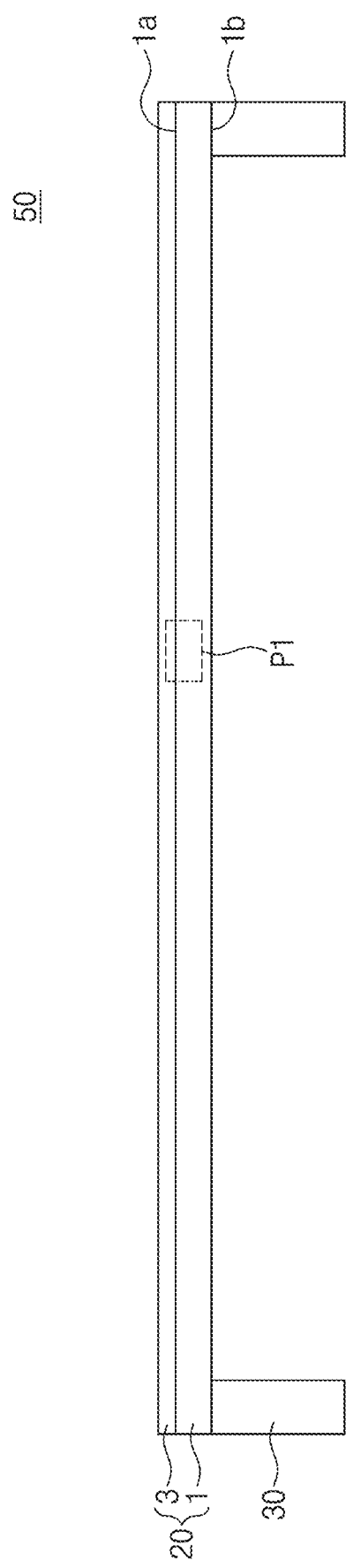
FIG. 1 illustrates a cross-sectional view showing a pellicle for a photomask, according to some example embodiments of inventive concepts.
Figure 2:
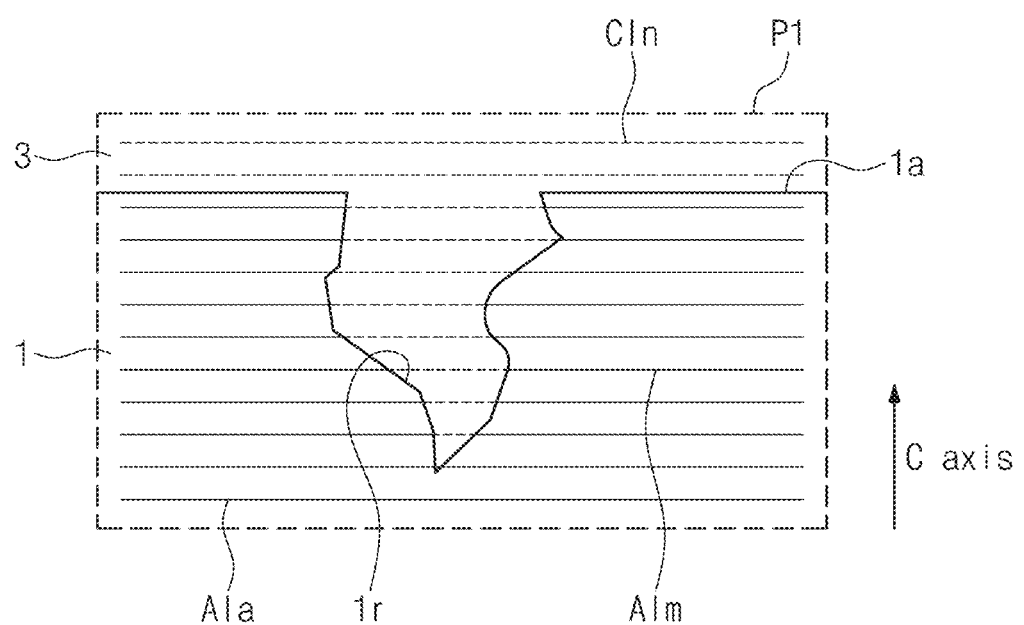
FIG. 2 illustrates an enlarged view showing section P1 of FIG. 1.

FIG. 1 illustrates a cross-sectional view showing a pellicle for a photomask, according to some example embodiments of inventive concepts. FIG. 2 illustrates an enlarged view showing section P1 of FIG. 1. FIGS. 3 to 6 illustrate carbon bond structures of atomic layers at different heights.

Referring to FIG. 1, a pellicle 50 for a photomask may include a pellicle membrane 20 and a pellicle frame 30 attached to an edge of the pellicle membrane. The pellicle 50 may be applicable to, e.g. used in, an extreme ultraviolet (EUV) mask used for EUV lithography. The pellicle membrane 20 may include a base layer 1 and a recovery layer 3. The base layer 1 may have a first surface 1a and a second surface 1b facing each other. The recovery layer 3 may be on the first surface 1a of the base layer 1. The pellicle frame 30 may be on the second surface 1b of the base layer 1. The base layer 1 and the recovery layer 3 may all contain carbon. The base layer 1 may be or may include, for example, at least one of a graphene thin layer or a graphite thin layer. The recovery layer 3 may have a similar structure to that of the base layer 1. A bond structure between carbon atoms contained in the base layer 1 may primarily include SP2 covalent bonds, which are planar bond structures, and secondly include SP3 covalent bonds, which are tetrahedral bond structures. For example, in the base layer 1, a content ratio of the SP2 covalent bonds to the SP3 covalent bonds may be about 70:30 to 90:10 or about 84:16 to 83:17. The pellicle frame 30 may have, for example, one of a regular square shape and a rectangular shape each of which has two pairs of parallel sides. The pellicle frame 30 may include a metal or an alloy of the metal, for example, aluminum, zinc, magnesium, stainless steel, molybdenum, zirconium, tungsten, or a combination thereof, or may be treated by anodizing or diamond-like carbon (DLC) technology.

Referring to FIGS. 1 and 2, at least one pinhole or cavity 1r may be present on the first surface 1a of the base layer 1. The recovery layer 3 may fill the pinhole 1r, while covering the first surface 1a of the base layer 1. The recovery layer 3 may have an identical or similar structure to that of graphene or graphite. A bond structure between carbon atoms contained in the recovery layer 3 may primarily include SP2 covalent bonds, which are planar bond structures, and secondly include SP3 covalent bonds, which are tetrahedral bond structures. A content/density of the SP2 covalent bonds between carbon atoms contained in the recovery layer 3 may be less than a content/density of the SP2 covalent bonds between carbon atoms contained in the base layer 1. The recovery layer 3 may include at least one of nitrogen, hydrogen, or oxygen, or a combination thereof, or a sub-combination thereof. A content/density of at least one of nitrogen, hydrogen, or oxygen contained in the recovery layer 3 may be greater than a content/density of at least one of nitrogen, hydrogen, or oxygen contained in the base layer 1.

Figure 3:
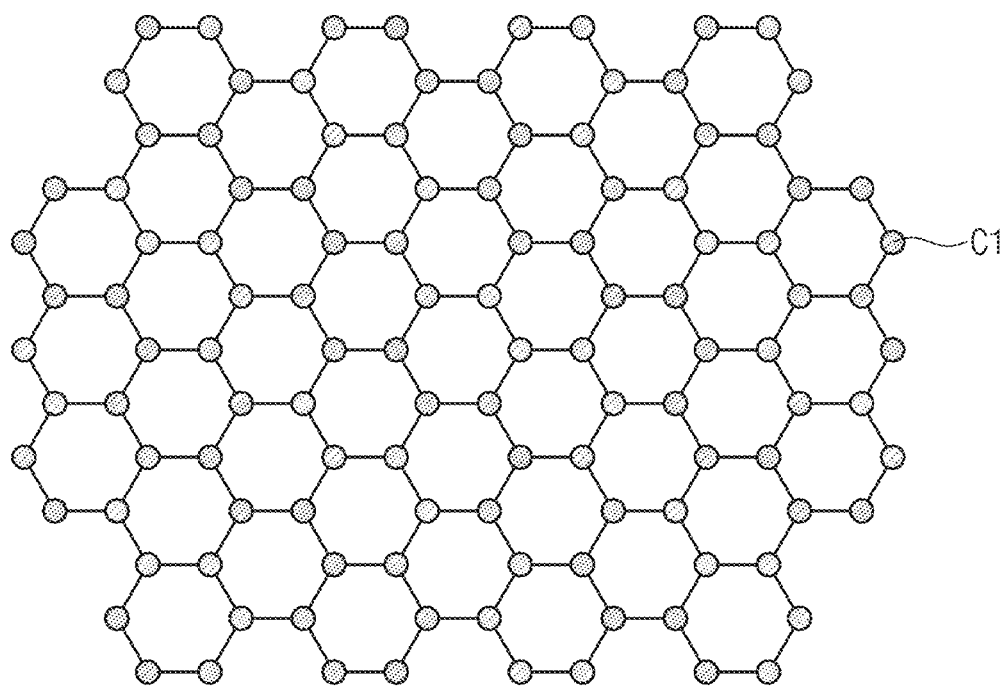
FIGS. 3 to 6 illustrate carbon bond structures of atomic layers at different heights.
Figure 5:
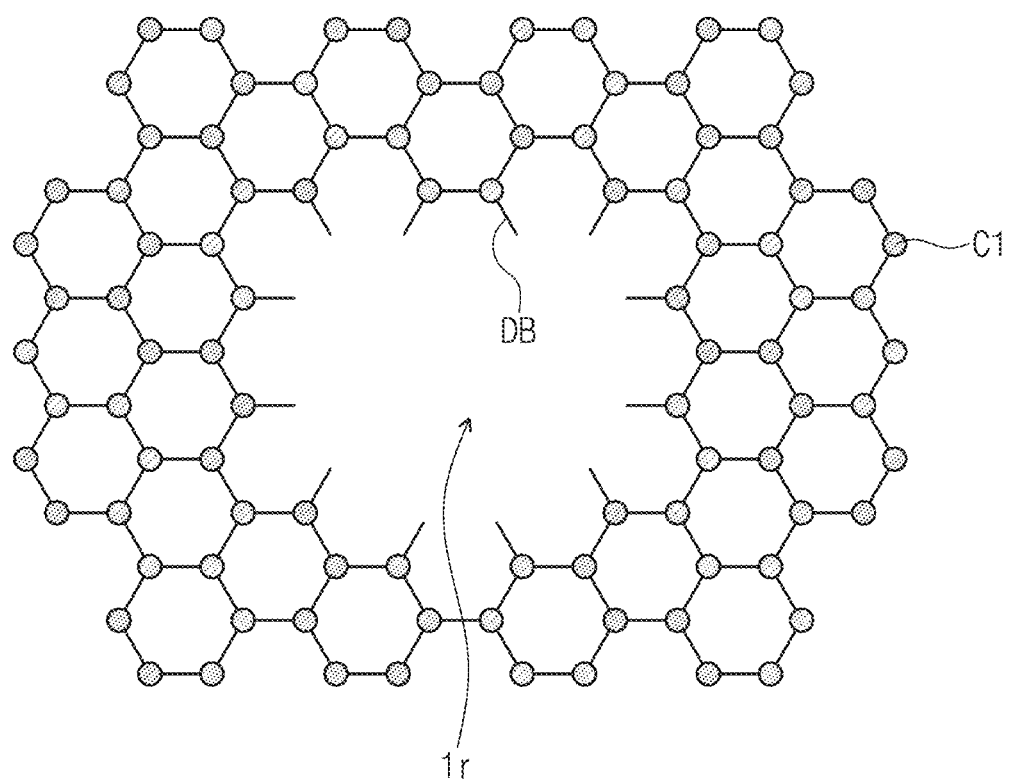

The base layer 1 may be provided therein with base atomic layers Ala and Alm. The base atomic layers Ala and Alm may include first base atomic layers Ala and second base atomic layers Alm spaced apart in a direction corresponding to a C-axis direction from the first base atomic layers Ala. The pinhole 1r may be formed in the second base atomic layers Alm. The C-axis direction may be perpendicular to surfaces of the base atomic layers Ala and Alm, or may be a thickness direction of the base layer 1. As shown in FIGS. 3 and 5, each of the base atomic layers Ala and Alm may include first carbon atoms C1 that form hexagonal structures.

Figure 4:
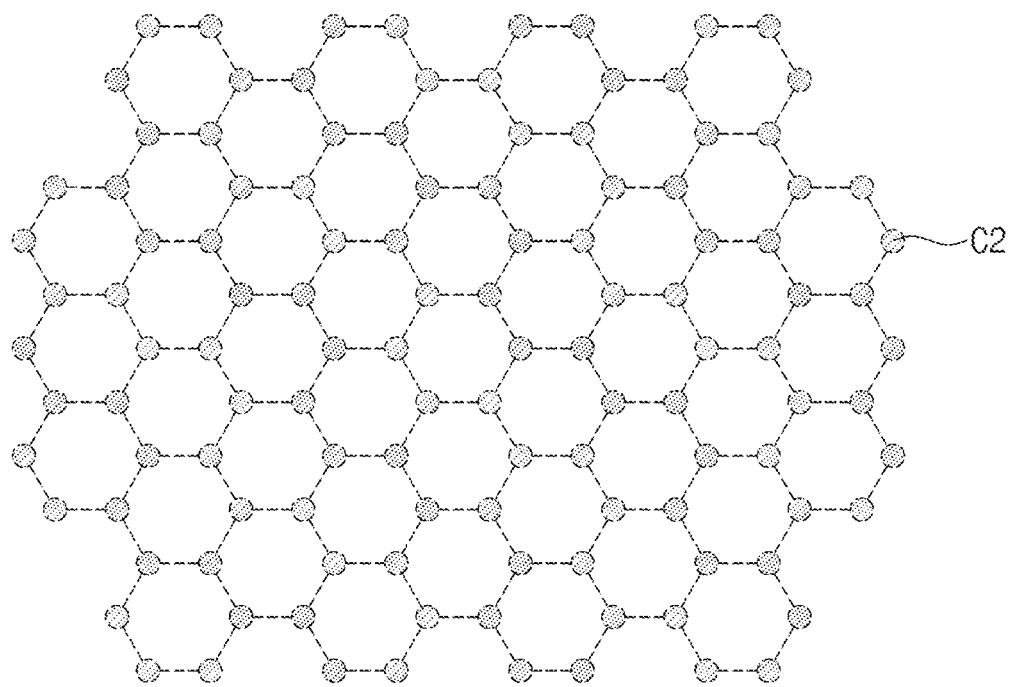

The recovery layer 3 may be provided therein with recovery atomic layers Cln spaced apart from each other in the C-axis direction. As shown in FIG. 4, each of the recovery atomic layers Cln may include second carbon atoms C2 that form hexagonal structures. Carbon bonds in the base atomic layers Ala and Alm and the recovery atomic layers Cln may primarily include SP2 covalent bonds that are oriented along a direction perpendicular to the C-axis direction. Carbon bonds in the base atomic layers Ala and Alm and the recovery atomic layers Cln may slightly include SP3 covalent bonds that are oriented along a direction parallel to the C-axis. A content/density of the SP3 covalent bonds between carbon atoms contained in the recovery layer 3 may be greater than a content/density of the SP3 covalent bonds between carbon atoms contained in the base layer 1.

As shown in FIG. 5, the second base atomic layer Alm may include the pinhole 1r that is a hollow area in which the first carbon atoms C1 are absent. A sidewall of the pinhole 1r may be provided thereon with dangling bonds DB and/or broken bonds of the first carbon atoms C1. When the base layer 1 exclusive of the recovery layer 3 is used as a pellicle membrane, the base layer 1 may suffer from damage such as partial loss of aperture caused by combination of the dangling bonds DB with gases such as hydrogen supplied in a photolithography process (e.g., caused when the first carbon atoms C1 are evaporated into methane ($CH_4$)). Accordingly, the damaged pellicle membrane may not protect a photomask The photomask may be attached with foreign substances, with the result that a photolithography process may not be reliably performed.

Figure 6:
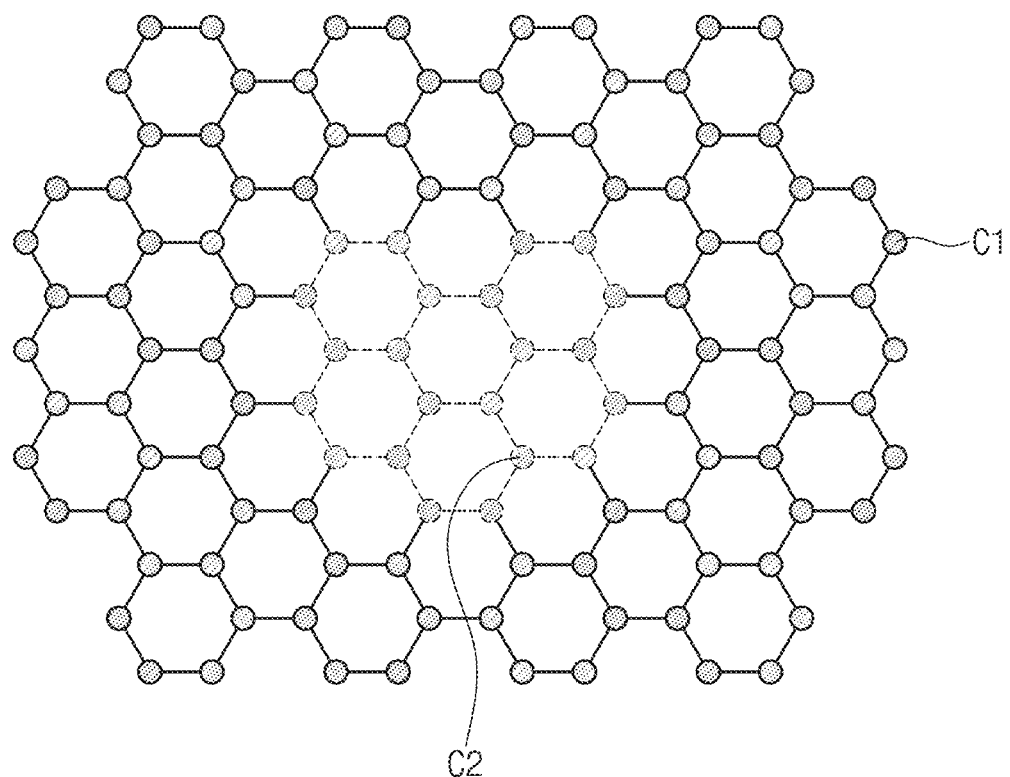

According to inventive concepts, the pinhole 1r may be filled with the recovery layer 3 to cure or reduce the impact of defects, such as the pinhole 1r, of the base layer 1. For example, as shown in FIG. 6, the second carbon atoms C2 contained in the recovery atomic layer Cln of the recovery layer 3 may be bonded to the first carbon atoms C1 contained in the second atomic layer Alm, and as a result, hexagonal aromatic rings may be formed with an SP2 covalent bond structure. The dangling bonds DB of the pinhole 1r may then be removed to prevent or reduce the impact of damage caused by hydrogen in a photolithography process. Accordingly, a photolithography process may be more reliably performed and the pellicle 50 may increase in lifespan or durability. The recovery atomic layer Cln may partially have an SP3 covalent bond structure in the pinhole 1r.

In some example embodiments, because the pellicle 50 for a photomask includes the recovery layer 3 containing atoms with a structure similar to that of the base layer 1 or because the recovery layer 3 has a carbon bond structure identical or similar to that of the base layer 1 or graphene, the pellicle 50 may have optical, physical, and/or chemical characteristics similar to those of the base layer 1.

Figure 7:
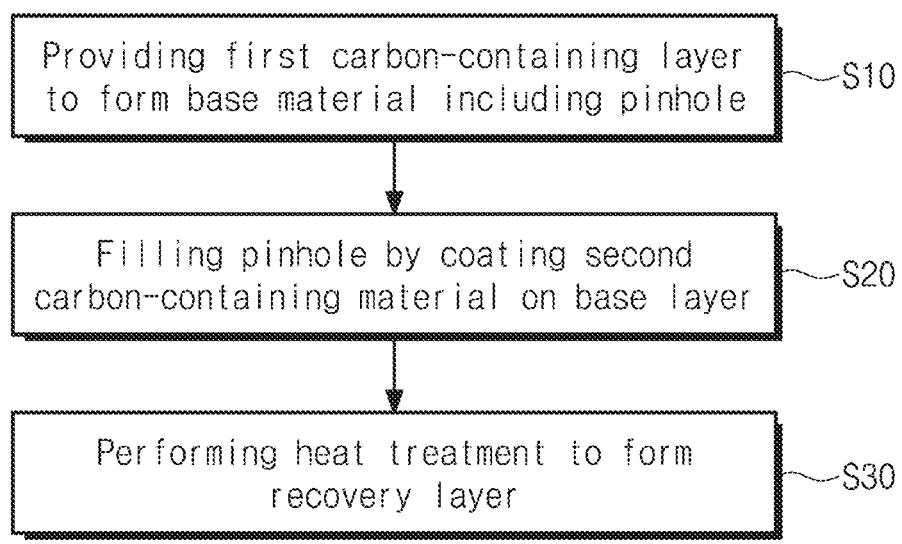
FIG. 7 illustrates a flow chart showing a method of fabricating a pellicle for a photomask, according to some example embodiments of inventive concepts.
Figure 8:
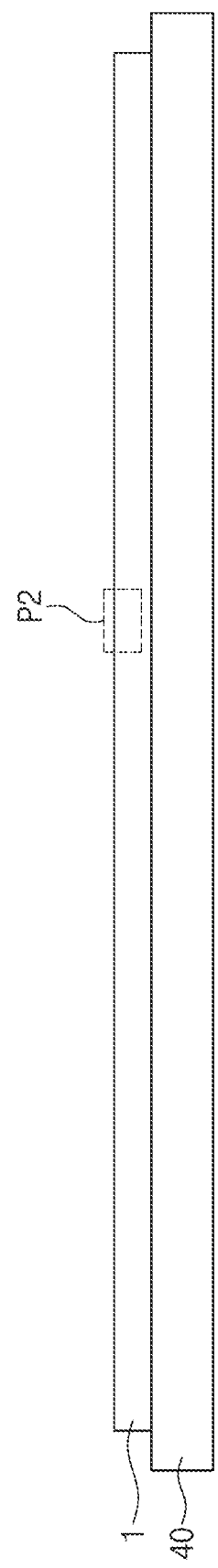
FIGS. 8 and 10 illustrate cross-sectional views showing a method of fabricating a pellicle for a photomask, according to some example embodiments of inventive concepts.
Figure 9:
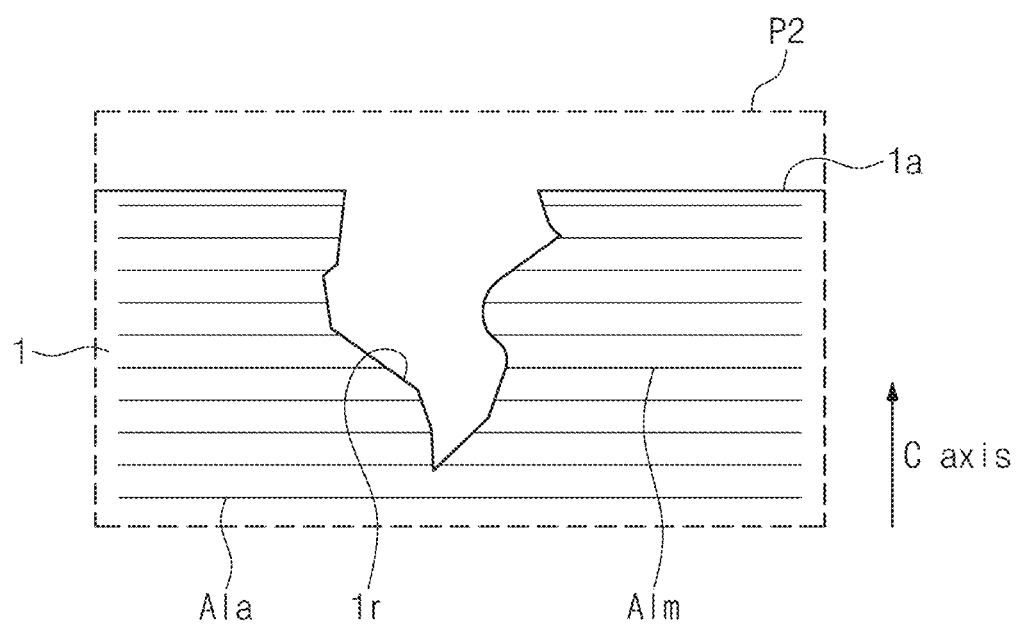
FIG. 9 illustrates an enlarged view showing section P2 of FIG. 8.
Figure 10:
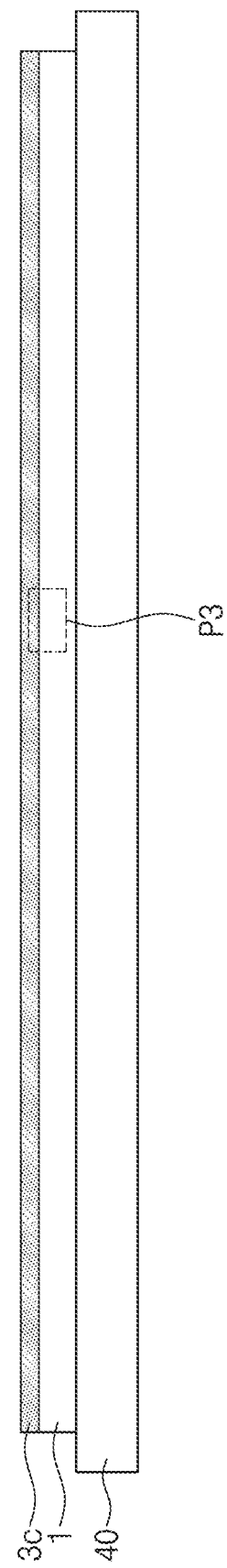
Figure 11:
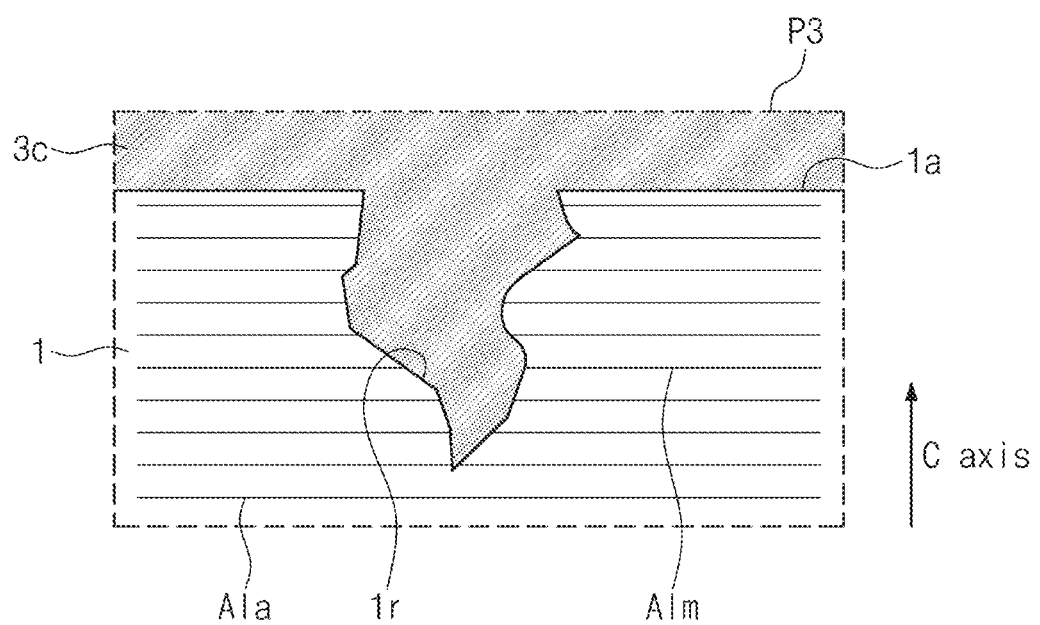
FIG. 11 illustrates an enlarged view showing section P3 of FIG. 10.
Figure 12:
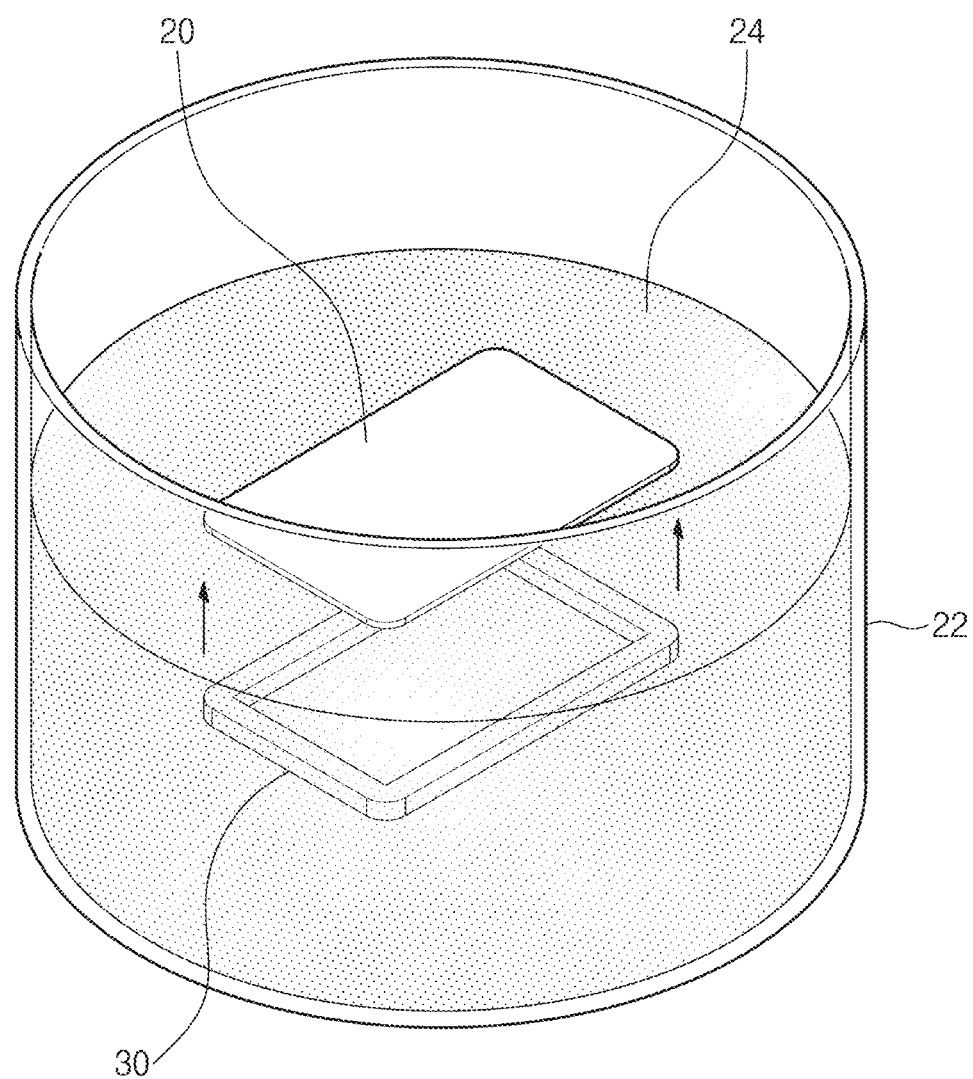
FIG. 12 illustrates a perspective view showing a step in a method of fabricating a pellicle for a photomask, according to some example embodiments of inventive concepts.

FIG. 7 illustrates a flow chart showing a method of fabricating a pellicle for a photomask, according to some example embodiments of inventive concepts. FIGS. 8 and 10 illustrate cross-sectional views showing a method of fabricating a pellicle for a photomask, according to some example embodiments of inventive concepts. FIG. 9 illustrates an enlarged view showing section P2 of FIG. 8. FIG. 11 illustrates an enlarged view showing section P3 of FIG. 10. FIG. 12 illustrates a perspective view showing a step in a method of fabricating a pellicle for a photomask, according to some example embodiments of inventive concepts.

Referring to FIGS. 7 to 9, a first carbon-containing material may be provided to form a base layer 1 including a pinhole 1r (S10). The base layer 1 may be formed using a deposition process, such as thermal chemical vapor deposition (CVD), plasma enhanced chemical vapor deposition (PECVD), microwave enhanced chemical vapor deposition (MECVD), inductively coupled plasma chemical vapor deposition (ICPCVD), low pressure chemical vapor deposition (LPCVD), atomic layer deposition (ALD), chemical vapor deposition (CVD), and/or molecular layer deposition (MLD). The plasma mentioned above may be generated by radio frequency (RF), alternating current (AC) frequency, or direct current (DC) discharge. For example, a catalytic metal substrate 40 may be provided thereon with vapor of the first carbon-containing material to grow a graphene or graphite thin layer. The catalytic metal substrate 40 may primarily include a carbon-adsorptive transition metal, such as nickel, copper, iron, or cobalt, and further include noble metal, such as gold, platinum, or silver. When the base layer 1 is formed by PECVD using plasma, the PECVD may be performed at a relatively low process temperature of about 300 to 700° C. When plasma is not used in a deposition process for forming the base layer 1, the catalytic metal substrate 40 or a chuck (not shown) that supports the catalytic metal substrate 40 may be under a temperature of about 1000° C. or higher. The first carbon-containing material may be or may include, for example, at least one of alkane, alkene, and alkyne each containing 1 to 10 carbon atoms. When carbon bonds in the first carbon-containing material are broken during the deposition process, and then when the catalytic metal substrate 40 is provided on its surface with carbon atoms originating from the broken carbon bonds, a graphene or graphite layer may be grown from the carbon atoms that are arranged to conform to the crystal plane of the surface of the catalytic metal substrate 40. The base layer 1 may be formed to have a thickness of, for example, about 0.34 to 50 nm. The base layer 1 may include a plurality of base atomic layers Ala and Alm, and further include at least one pinhole 1r on a surface thereof. A description of the base atomic layers Ala and Alm may be identical or similar to that discussed with reference to FIGS. 3 and 5. For example, as shown in FIG. 5, dangling bonds DB may be present in the pinhole 1r.

Referring to FIGS. 7, 10, and 11, a second carbon-containing material may be coated on the base layer 1, filling the pinhole 1r (S20). The coating of the second carbon-containing material may form a second carbon-containing material layer 3c that not only fills the pinhole 1r but also covers a first surface 1a of the base layer 1. The second carbon-containing material easily coat and sufficiently wet to the base layer 1 to successfully fill the pinhole 1r. After a heat treatment process, the second carbon-containing material may decompose to form SP2 covalent bonds with first carbon atoms (see C1 of FIG. 3) contained in the base atomic layers Ala and Alm of the base layer 1. The second carbon-containing material may be or may include a polymer or a carbon compound containing at least one of carbon, nitrogen, oxygen, and hydrogen. The second carbon-containing material may be or may include, for example, catecholamine. The catecholamine may include dopamine (DA), polydopamine (PD), norepinephrine, or epinephrine. The catecholamine may be a polymer of polyethyleneimine (PEI) and pyrogallol (PG). The second carbon-containing material may be at least one of fullerene, carbon black, activated charcoal, charcoal, carbon nanoribbon, graphene quantum dots, graphene oxide, and nanodiamond. The second carbon-containing material may exclude, i.e. may not include, an aromatic compound having two or more benzene rings. The second carbon-containing material may be used alone or in the form of a solution with a solvent. The catecholamine may be formed by mixing and polymerizing polyethyleneimine (PEI) and pyrogallol (PG). Water may be used as the solvent.

As an example, a first solution may be prepared to include polyethyleneimine (PEI), pyrogallol (PG), and water. The preparation of the first solution may be as follows. First, polyethyleneimine and water may be mixed to prepare a first preliminary solution in which the polyethyleneimine is dissolved in the water. The first preliminary solution may have a polyethyleneimine concentration of about 1.25 to 20 wt %. Next, the pyrogallol and the water may be mixed to prepare a second preliminary solution in which the pyrogallol is dissolved in the water. The second preliminary solution may have a pyrogallol concentration of about 0.0125 to 0.2 M. The first solution may be prepared when the first preliminary solution and the second preliminary solution are mixed at a volume ratio of 1:1. The first solution may include catecholamine that is formed from the polymerization of the polyethyleneimine and the pyrogallol. The first solution may be coated on the base layer 1. A spin coating process may be employed to coat the first solution on the base layer 1. The spin coating process may be performed, for example, at about 2,500 to 7,000 rpm for about 30 to 240 seconds.

Referring to FIGS. 7, 1, and 2, after the second carbon-containing material is coated, a heat treatment process may be performed at a first process temperature to form a recovery layer 3 (S30). The first process temperature may fall within a range, for example, from about 900° C. to about 2,000° C. The heat treatment process may break bonds of carbon atoms with nitrogen, hydrogen, and oxygen atoms contained in the second carbon-containing material, such that the nitrogen, hydrogen, and oxygen atoms may be removed and remaining carbon atoms (corresponding to the second carbon atoms C2 of FIG. 4) may combine with the first carbon atoms (see C1 of FIG. 3) of the base layer 1, which may result in the formation of hexagonal aromatic rings. The base layer 1 may serve as a seed layer in the heat treatment process. The recovery layer 3 may have a thickness of about 0.5 to 10 nm. Through the processes above, a pellicle membrane 20 may be formed to include the base layer 1 and the recovery layer 3. An inert gas, such as argon, may be supplied during the heat treatment process. Hydrogen may be additionally supplied during the heat treatment process. A flow amount ratio of argon to hydrogen may be, for example, about 90:10 to 99:1.

The recovery layer 3 finally formed by the heat treatment process may have a chemical bond structure identical or similar to that discussed with reference to FIGS. 2, 4, and 6. For example, a bond structure between carbon atoms contained in the recovery layer 3 may primarily include SP2 covalent bonds, which are planar bond structures, and slightly include SP3 covalent bonds, which are tetrahedral bond structures. A content/density of the SP2 covalent bonds between carbon atoms contained in the recovery layer 3 may be less than a content/density of the SP2 covalent bonds between carbon atoms contained in the base layer 1. Nitrogen, hydrogen, and oxygen contained in the second carbon-containing material may not be completely removed during the heat treatment process, but may remain in the recovery layer 3. The recovery layer 3 may then include at least one of nitrogen, hydrogen, or oxygen, or a sub-combination thereof, or a combination thereof. A content/density of nitrogen, hydrogen, and/or oxygen contained in the recovery layer 3 may be greater than a content/density of nitrogen, hydrogen, and/or oxygen contained in the base layer 1.

The pellicle membrane 20 may be separated from the catalytic metal substrate 40. The separation of the pellicle membrane 20 may be performed in a first liquid. For example, the catalytic metal substrate 40 on which the pellicle membrane 20 is formed may be provided into the first liquid, and then the pellicle membrane 20 may be separated from the catalytic metal substrate 40. The first liquid may be or may include, for example, one of more of an iron chloride aqueous solution, an ammonium persulfate aqueous solution, a cerium ammonium nitrate aqueous solution, and a dimethylformamide aqueous solution. A rinse process using a second liquid may be additionally performed on the separated pellicle membrane 20. The second liquid may include at least one of deionized water, nitric acid, hydrochloric acid, acetic acid, hydrofluoric acid, aqua regia, ethyl alcohol, methyl alcohol, and isopropyl alcohol.

Referring to FIGS. 1 and 12, the separated pellicle membrane 20 may be transcribed onto a pellicle frame 30. This transcription process may be performed in a third liquid 24. For example, the third liquid 24 may be provided into a water tank 22, and the pellicle membrane 20 may be floated on the third liquid 24. The pellicle frame 30 may be elevated from within the third liquid 24 and then attached to the pellicle membrane 20. The third liquid 24 may be at least one of deionized water and alcohol. The alcohol may include at least one of methyl alcohol, ethyl alcohol, and isopropyl alcohol. The pellicle frame 30 and the pellicle membrane 20 may be attached, e.g. directly attached, to each other by, for example, a Van der Waals force without any glue material between the pellicle frame 30 and the pellicle membrane 20. After that, the pellicle frame 30 and the pellicle membrane 20 may be dried. Alternatively, the pellicle membrane 20 may be attached to the pellicle frame 30 in a dry method performed at atmosphere or vacuum condition, not in the third liquid 24. At this stage, a heat treatment process may be additionally performed or an adhesive may be used.

In some example embodiments, the recovery layer 3 may be used using catecholamine, which is easily coated on the base layer 1, with little to no effort fills the pinhole or cavity 1r, and is combined with the base layer 1 to successfully form regular hexagonal aromatic rings. As such, a pellicle 50 for a photomask may be provided to increase surface uniformity of the pellicle membrane 20 and to have superior optical characteristics, durability, and mechanical strength.

Figure 13A:
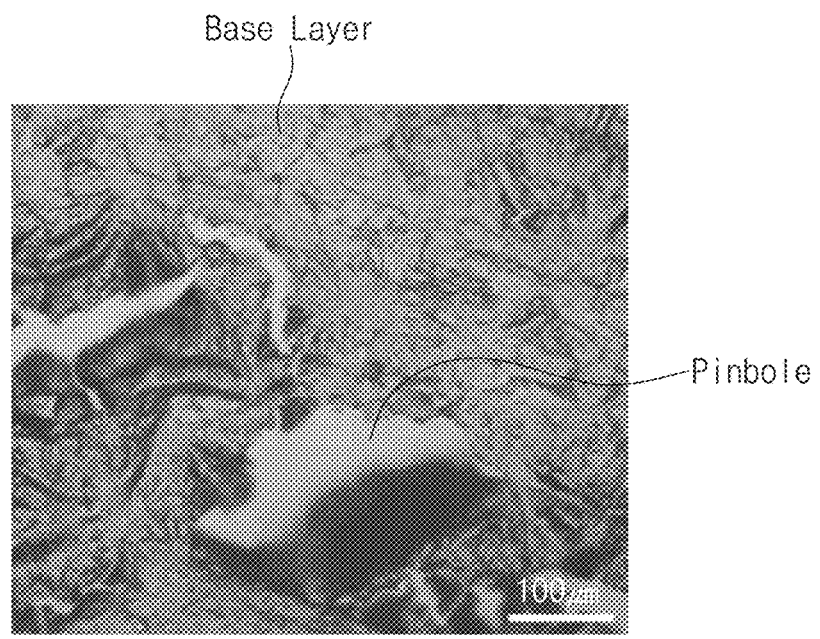
FIG. 13A illustrates an optical image of a base layer manufactured according to some example embodiments of inventive concepts.

FIG. 13A illustrates an optical image of a base layer manufactured according to some example embodiments of inventive concepts. FIG. 13A shows that the pinhole 1r is present on the base layer 1. The base layer 1 may be a graphene or graphite thin layer. The base layer 1 may have a defect-free region (at a right upper side of FIG. 13A) on which the pinhole 1r is absent and whose surface is relatively uniform and clean.

Figure 13B:
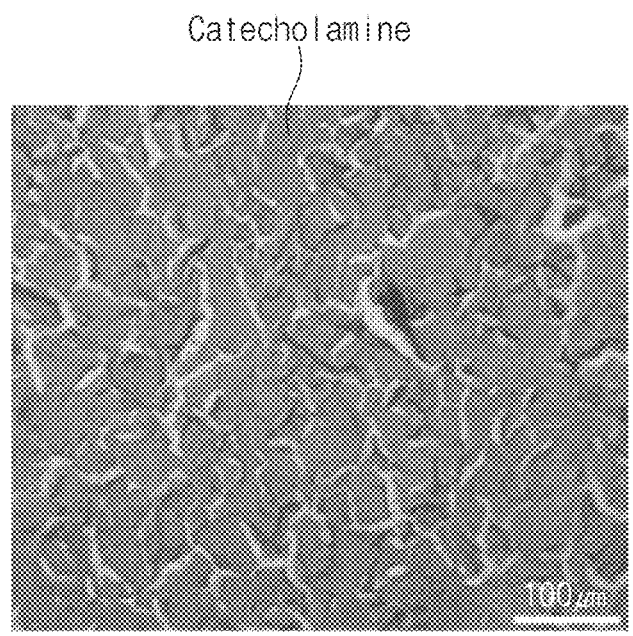
FIG. 13B illustrates an optical image obtained after coating catecholamine on the base layer of FIG. 13A.
Figure 13C:
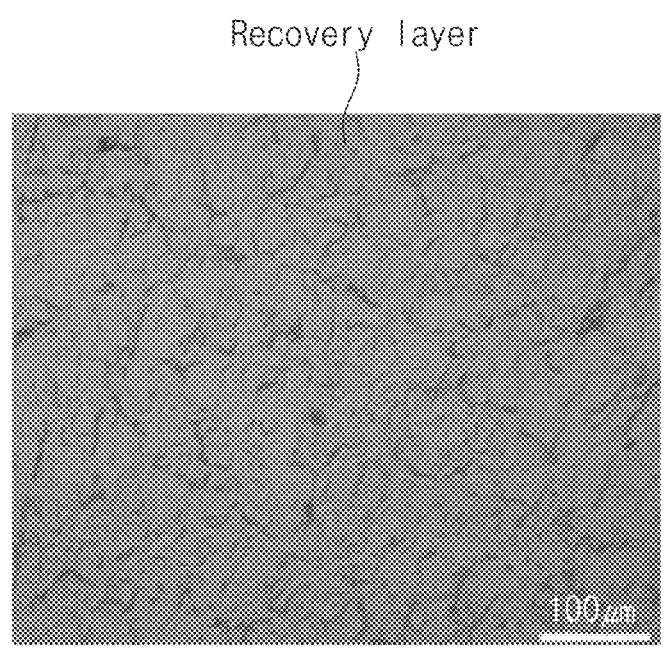
FIG. 13C illustrates an optical image obtained after forming a recovery layer by thermally treating the catecholamine of FIG. 13B.

FIG. 13B illustrates an optical image obtained after coating catecholamine on the base layer of FIG. 13A. FIG. 13C illustrates an optical image obtained after forming a recovery layer by thermally treating the catecholamine of FIG. 13B. As shown in FIG. 13C, the recovery layer 3 has a uniform and clean surface and has no pinhole 1r. FIG. 13C shows an image similar to that of the defect-free region on which the pinhole 1r is absent as illustrated in FIG. 13A. The recovery layer 3 may have a surface identical or similar to that of a graphene or graphite thin layer having no defects such as the pinhole 1r.

Figure 14:
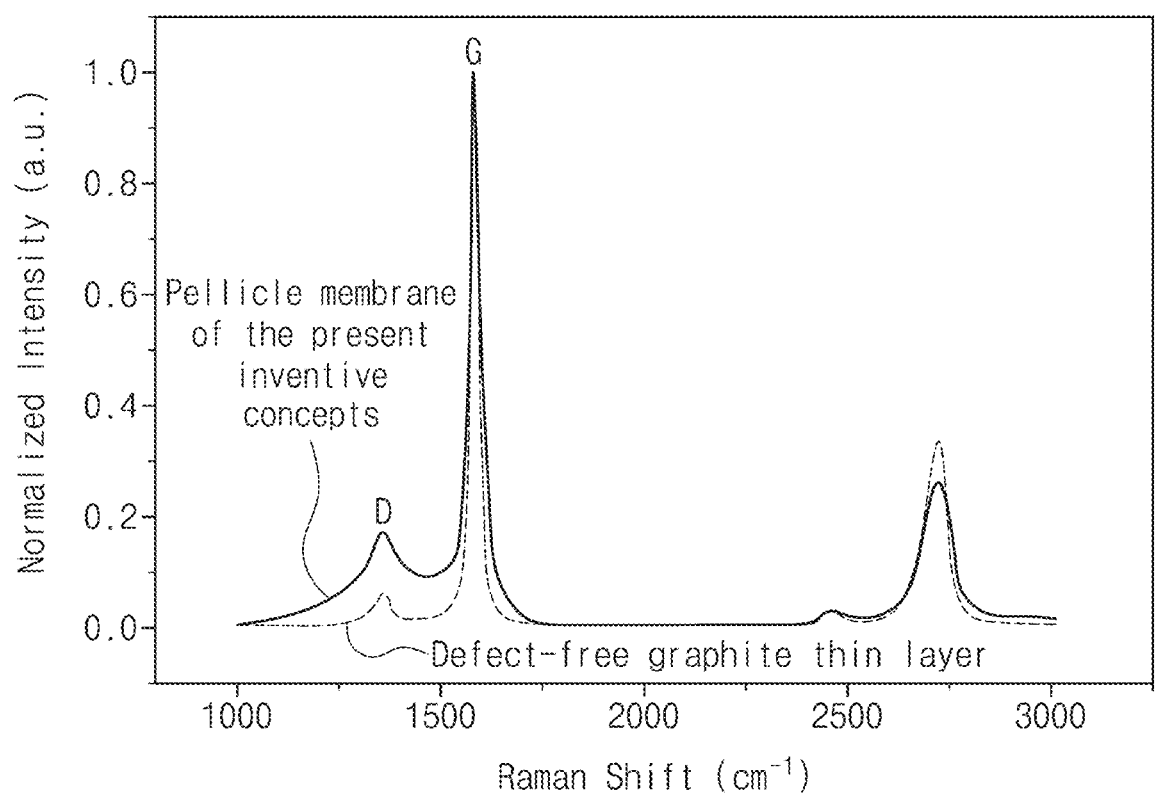
FIG. 14 illustrates a graph showing Raman spectrums of a defect-free graphite layer and a pellicle membrane that is manufactured by a method of fabricating a pellicle for a photomask, according to some example embodiments of inventive concepts.

FIG. 14 illustrates a graph showing a first Raman spectrum A of defect-free graphite layer and a second Raman spectrum B of pellicle membrane that is manufactured by a method of fabricating a pellicle for a photomask, according to some example embodiments of inventive concepts.

Referring to FIG. 14, the pellicle membrane 20 may have a second Raman spectrum B whose intensity ratio of D peak to G peak, or D/G intensity ratio, is about 0 to 1, or about 0.06 to 0.17. The G peak may appear at Raman shift of about 1580 $cm^{-1}$, arising from a vibration mode corresponding to stretching between carbon-to-carbon bonds having SP2 covalent bond structures and providing information about whether or not hexagonal aromatic rings are included. The D peak may appear at Raman shift of about 1340 to 1350 $cm^{-1}$, arising from defects such as carbon atoms having SP3 covalent bond structures and carbon vacancies. FIG. 14 shows that carbon bonds in the pellicle membrane 20 may have relatively more SP2 covalent bond structures than SP3 covalent bond structures. FIG. 14 also shows that the second Raman spectrum B of the pellicle membrane 20 may have a similar shape to the first Raman spectrum A of a defect-free graphite thin layer. For example, each of the base layer 1 and the recovery layer 3 included in the pellicle membrane 20 may have a similar structure to that of a defect-free graphite thin layer.

The pellicle membrane 20 may have an absorption coefficient (or extinction coefficient) of about 0.01 or less, or about 0.0069 to 0.01, with respect to light whose wavelength is about 13.5 nm. The terms "absorption coefficient" or "extinction coefficient" may mean a coefficient that expresses a degree of reduction in amount of wavelength (light) or radiation when passing through a certain layer. Because the pellicle membrane 20 has an absorption coefficient (or extinction coefficient) of about 0.01 or less, the pellicle membrane 20 may not or may absorb very little light. Accordingly, the pellicle membrane 20 may be applicable to an EUV photolithography process, and may contribute to the formation of ultra-fine patterns, e.g. ultrafine patterns used in semiconductor manufacturing.

The pellicle membrane 20 may have a tensile strength, for example, of about 200 MPa to about 3 GPa. The tensile strength of about 200 MPa to about 3 GPa may refer to a tensile strength in a horizontal direction, for example, perpendicular to the C-axis direction of FIG. 2. In such cases, the pellicle membrane 20 may be prevented or significantly reduced from tears or wrinkles, which may result in a decrease in process failure.

Figure 15:
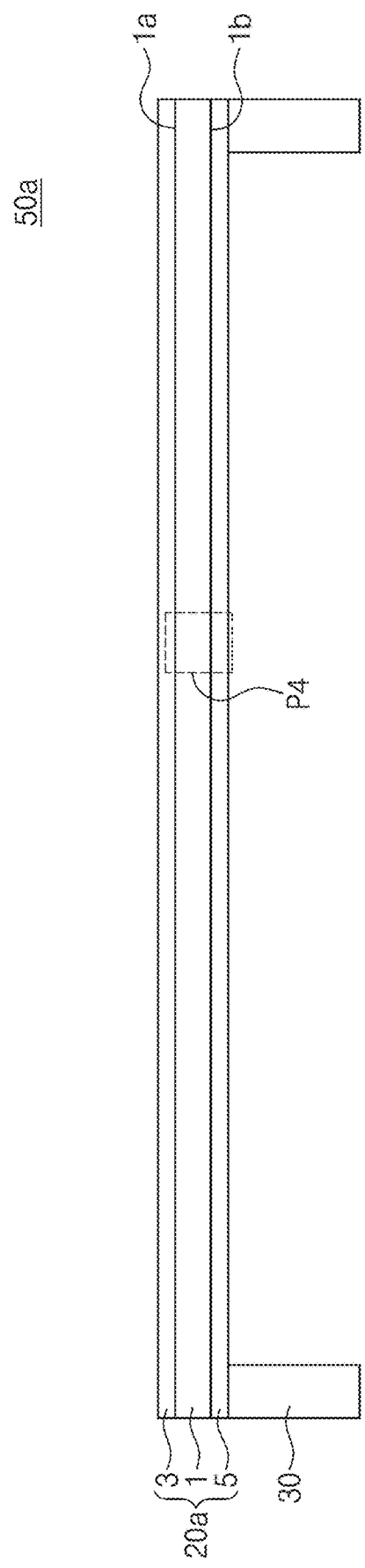
FIG. 15 illustrates a cross-sectional view showing a pellicle for a photomask, according to some example embodiments of inventive concepts.
Figure 16:
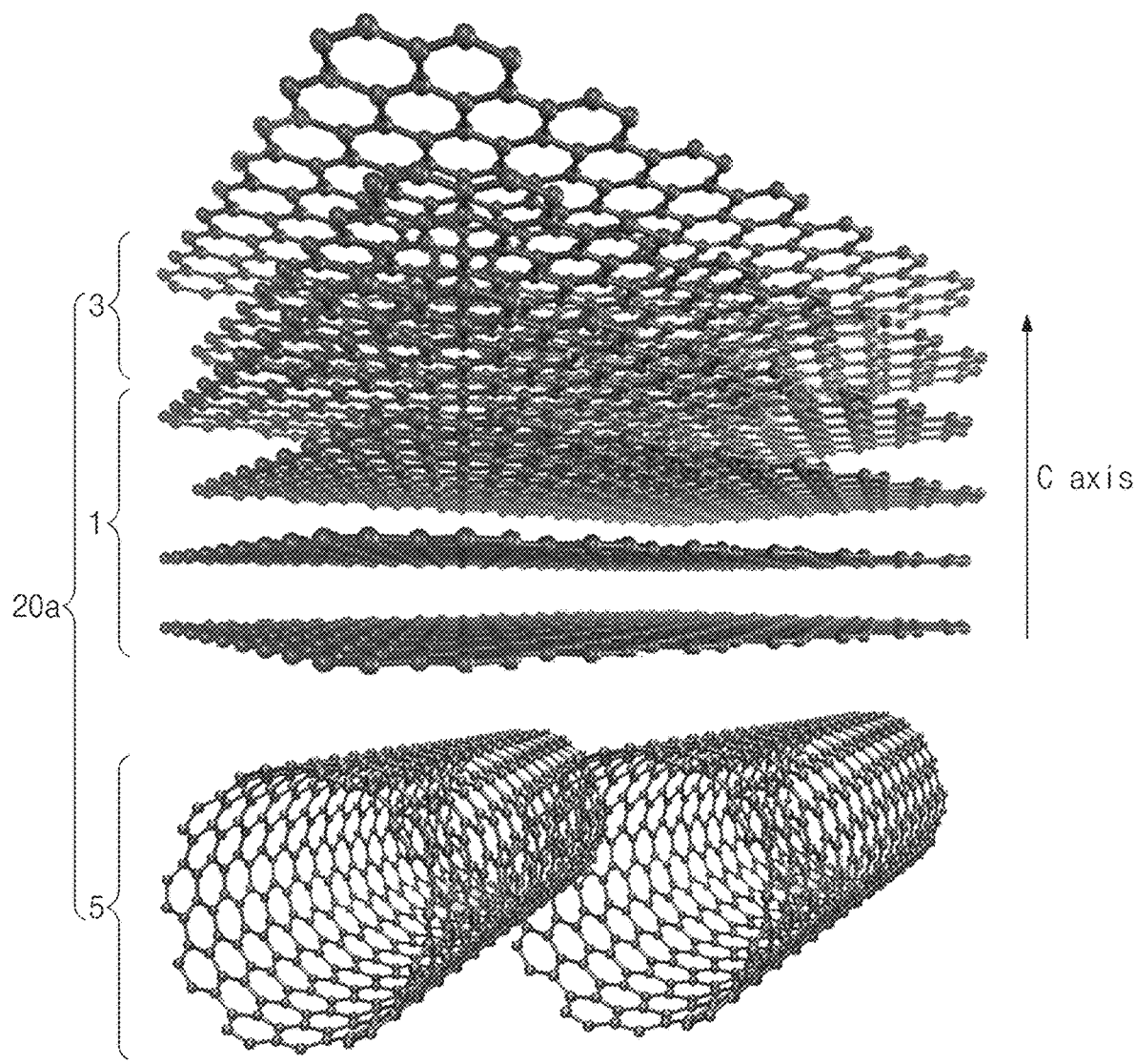
FIG. 16 illustrates an enlarged view showing section P4 of FIG. 15.

FIG. 15 illustrates a cross-sectional view showing a pellicle for a photomask, according to some example embodiments of inventive concepts. FIG. 16 illustrates an enlarged view showing section P4 of FIG. 15.

Referring to FIGS. 15 and 16, a pellicle 50a for a photomask may include a pellicle membrane 20a that is further provided with a support layer 5 on the second surface 1b of the base layer 1. The support layer 5 may have a different crystal structure from that of the base layer 1. The base layer 1 may have a tensile strength in the C-axis direction less than a tensile strength in a thickness direction (e.g., the C-axis direction) of the support layer 5. The support layer 5 may be or may include, for example, at least one of diamond-like carbon (DLC) and carbon nanotube. FIG. 16 shows an example in which the support layer 5 is carbon nanotube. The carbon nanotube has a cylindrical shape, and then has a tensile strength in the C-axis direction (e.g., in a direction perpendicular to a longitudinal direction of the carbon nanotube) greater than a tensile strength of a graphene or graphite thin layer. Carbon bonds in the carbon nanotube may form SP2 covalent bond structures to constitute regular hexagonal aromatic rings. The recovery layer 3 and the base layer 1 may be identical or similar to those discussed with reference to FIGS. 1 to 6. A content/density of SP2 covalent bonds between carbon atoms contained in the recovery layer 3 may be less than a content/density of SP2 covalent bonds between carbon atoms contained in the support layer 5. A content/density of nitrogen, hydrogen, and/or oxygen contained in the recovery layer 3 may be greater than a content/density of nitrogen, hydrogen, and/or oxygen contained in the support layer 5. The support layer 5 may include at least one of iron, cobalt, and nickel.

The following describes a process of fabricating the pellicle membrane 20a of FIG. 15. As discussed with reference to FIGS. 7 to 11, the base layer 1 and the recovery layer 3 may be formed. The base layer 1 and the recovery layer 3 may be separated from the catalytic metal substrate 40. The support layer 5 may be individually formed. When the support layer 5 includes carbon nanotube, arc electric discharge, thermal deposition, or plasma deposition may be performed to form the support layer 5 on a second catalytic metal substrate. The second catalytic metal substrate may be or may include at least one of iron, cobalt, and nickel. The support layer 5 may be separated from the second catalytic metal substrate. At this stage, at least one of iron, cobalt, and nickel constituting the second catalytic metal substrate may remain on the support layer 5. The support layer 5 may thus include at least one of iron, cobalt, and nickel. The support layer 5 may be placed on the second surface 1b of the base layer 1, and a heat treatment process may be performed at a second process temperature. The second process temperature may be less than the first process temperature discussed with reference to FIG. 7. The second process temperature may fall within a range, for example, from about 100° C. to about 300° C. Alternatively, similarly to that discussed with reference to FIG. 12, the support layer 5 and the base layer 1 may be attached to each other in a liquid. In this case, the support layer 5 and the base layer 1 may be combined with each other by a Van der Waals force.

FIGS. 17 to 19 and 21 to 23 illustrate cross-sectional views showing a pellicle for a photomask, according to some example embodiments of inventive concepts. FIG. 20 illustrates an enlarged view showing section P5 of FIG. 19.

Figure 17:
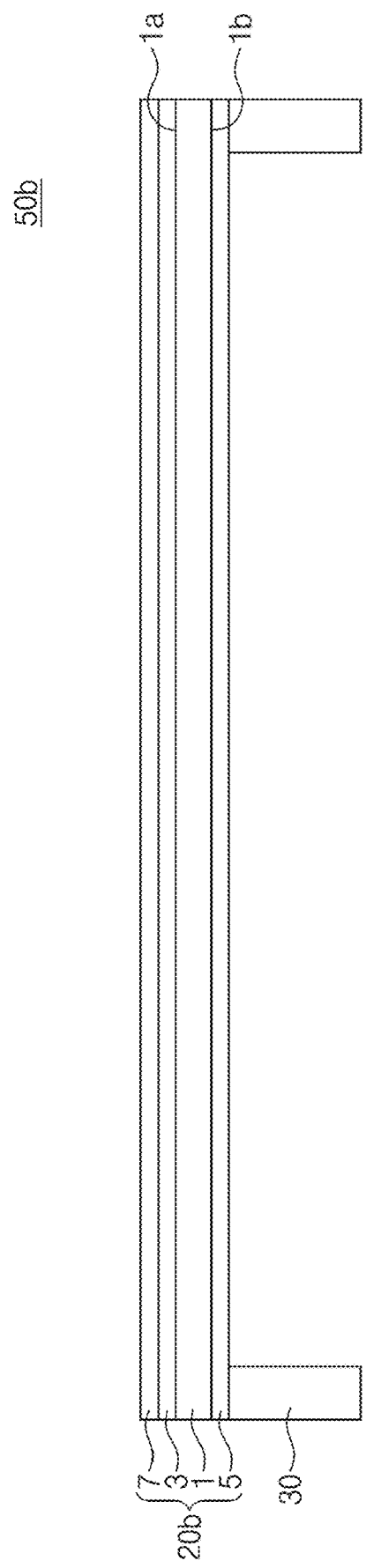
FIGS. 17 to 19 and 21 to 23 illustrate cross-sectional views showing a pellicle for a photomask, according to some example embodiments of inventive concepts.

Referring to FIG. 17, a pellicle 50b for a photomask may include a pellicle membrane 20b that is further provided with a capping layer 7 on the recovery layer 3 of FIG. 15. The capping layer 7 may include at least one of boron, boron carbide, and boron nitride. The capping layer 7 may has a role to prevent or reduce the likelihood of reaction between hydrogen supplied in a photolithography process and a surface of one of the recovery layer 3 and the base layer 1. Other structural features may be identical or similar to those discussed above with reference to FIG. 15.

Figure 18:
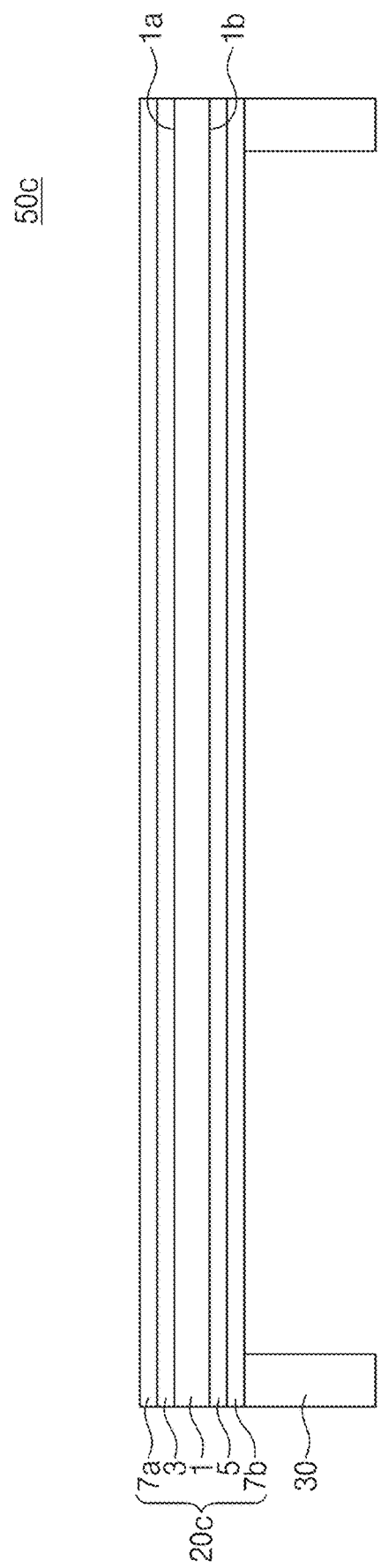

Referring to FIG. 18, a pellicle 50c for a photomask may include a pellicle membrane 20c that is further provided with a first capping layer 7a on the recovery layer 3 of FIG. 15 and a second capping layer 7b under the support layer 5 of FIG. 15. Each of the first and second capping layers 7a and 7b may include at least one of boron, boron carbide, and boron nitride.

Alternatively, the support layer 5 may be excluded such that the second capping layer 7b may be attached to, e.g. directly attached to, the second surface 1b of the base layer 1.

Figure 19:
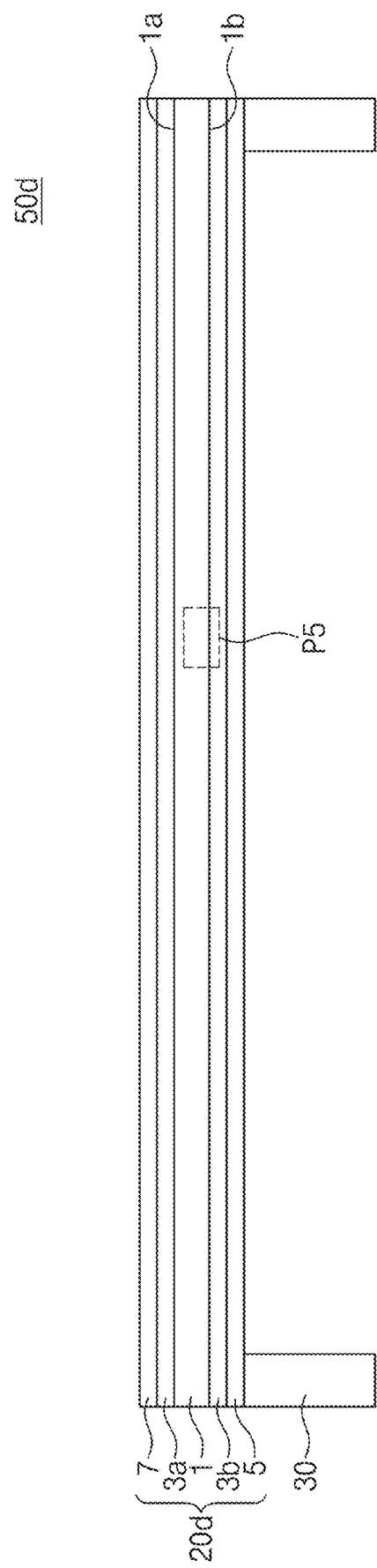
Figure 20:
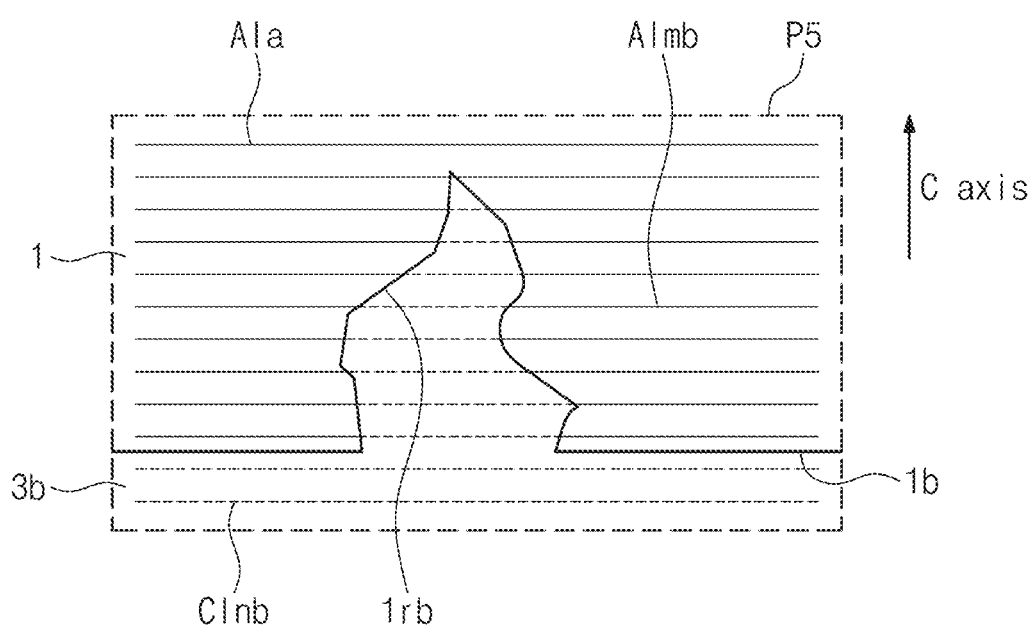
FIG. 20 illustrates an enlarged view showing section P5 of FIG. 19.

Referring to FIGS. 19 and 20, a pellicle 50d for a photomask may include a pellicle membrane 20d that is further provided with a second recovery layer 3b between the base layer 1 and the support layer 5 of FIG. 17. A first recovery layer 3a of FIG. 18 may correspond to the recovery layer 3 of FIG. 17. A lower pinhole 1rb may also be formed on the second surface 1b of the base layer 1. The base layer 1 may further include third base atomic layers Almb adjacent to the second surface 1b. The lower pinhole 1rb may be formed in the third base atomic layers Almb. The third base atomic layers Almb may have carbon bond structures that are identical or similar to those of the second base atomic layers Alm discussed with reference to FIG. 5. The second recovery layer 3b may fill the lower pinhole 1rb. The second recovery layer 3b may be identical or similar to the recovery layer 3 discussed with reference to FIGS. 1 to 6. For example, the second recovery layer 3b may include second recovery atomic layers Clnb. The second recovery atomic layers Clnb may have carbon bond structures that are identical or similar to those of the recovery atomic layers Cln discussed with reference to FIG. 4. For example, the second recovery layer 3b may cure defects such as the lower pinhole 1rb. A content/density of SP2 covalent bonds between carbon atoms contained in the second recovery layer 3b may be less than a content/density of SP2 covalent bonds between carbon atoms contained in the base layer 1. A content/density of nitrogen, hydrogen, and/or oxygen contained in the second recovery layer 3b may be greater than a content/density of nitrogen, hydrogen, and/or oxygen contained in the base layer 1. The formation of the second recovery layer 3b may be identical or similar to the formation of the recovery layer 3 discussed with reference to FIG. 7.

Figure 21:
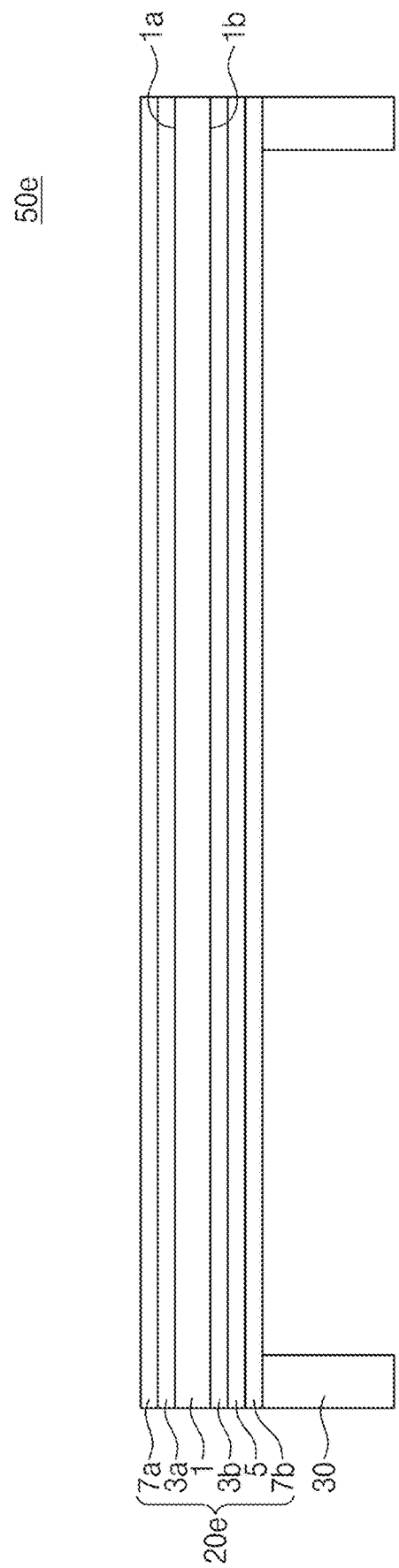

Referring to FIG. 21, a pellicle 50e for a photomask may include a pellicle membrane 20e that is further provided with a first capping layer 7a on the first recovery layer 3a of FIG. 19 and a second capping layer 7b under the support layer 5 of FIG. 19. Other structural features may be identical or similar to those discussed above.

Figure 22:
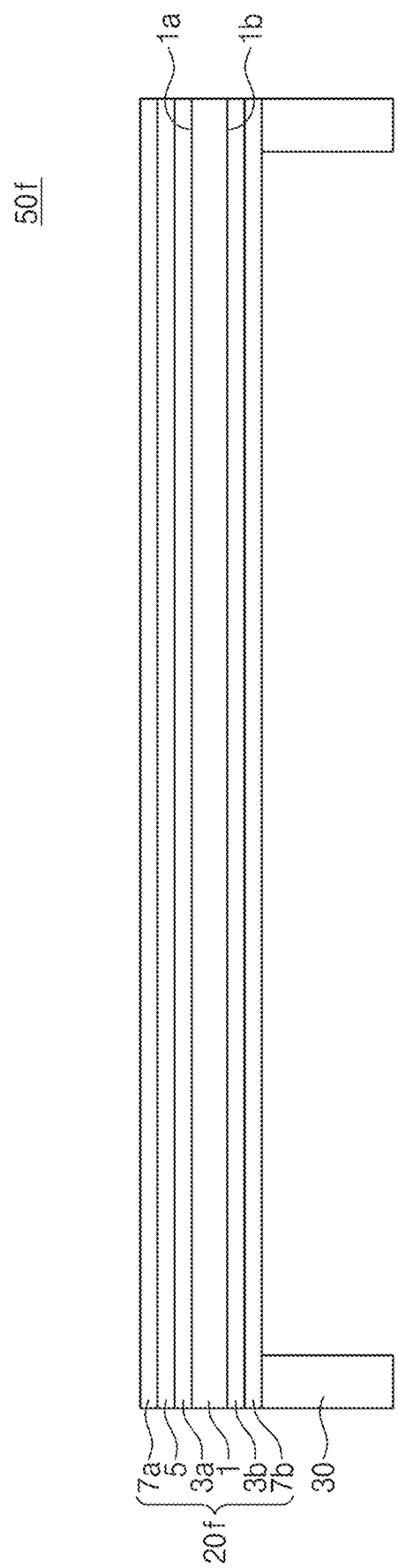

Referring to FIG. 22, a pellicle 50f for a photomask may include a pellicle membrane 20f that differs from the pellicle membrane 20e of FIG. 21 in that the support layer 5 is interposed between the first recovery layer 3a and the first capping layer 7a, but not between the second recovery layer 3b and the second capping layer 7b. Other structural features may be identical or similar to those discussed above.

Figure 23:
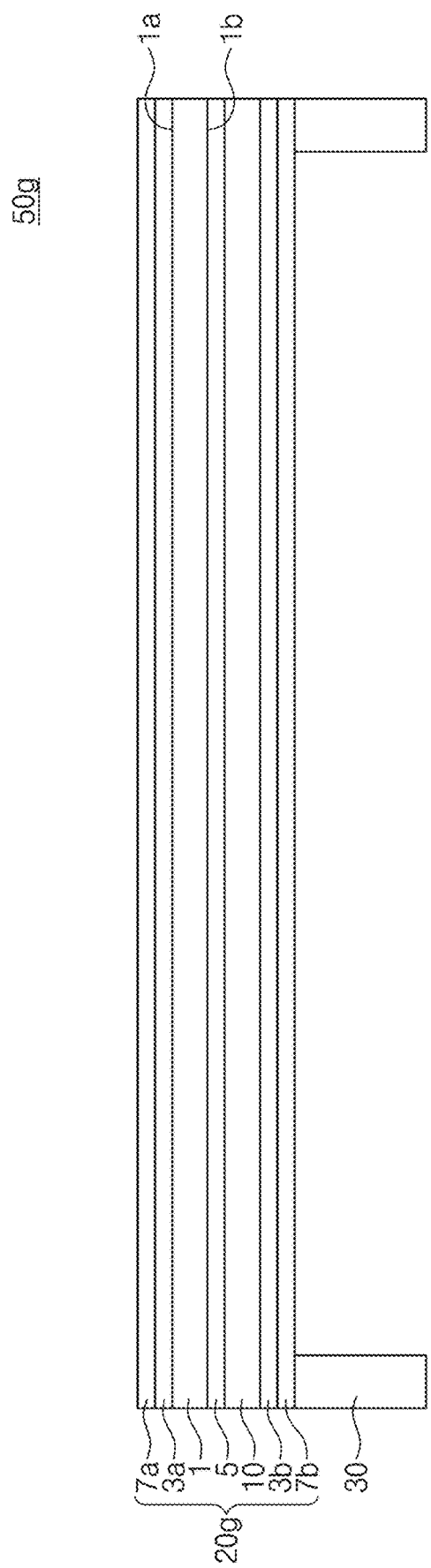

Referring to FIG. 23, a pellicle 50g for a photomask may include a pellicle membrane 20g in which the first recovery layer 3a and the first capping layer 7a are sequentially stacked on the first surface 1a of the base layer 1. The pellicle membrane 20g may further include a second base layer 10. The second surface 1b of the base layer 1 may be sequentially provided thereon with the support layer 5, the second base layer 10, the second recovery layer 3b, and the second capping layer 7b. The base layer 1 may be called a first base layer. Each of the first and second base layers 1 and 10 may be identical or similar to the base layer 1 discussed with reference to FIGS. 1 to 6.

Figure 24:
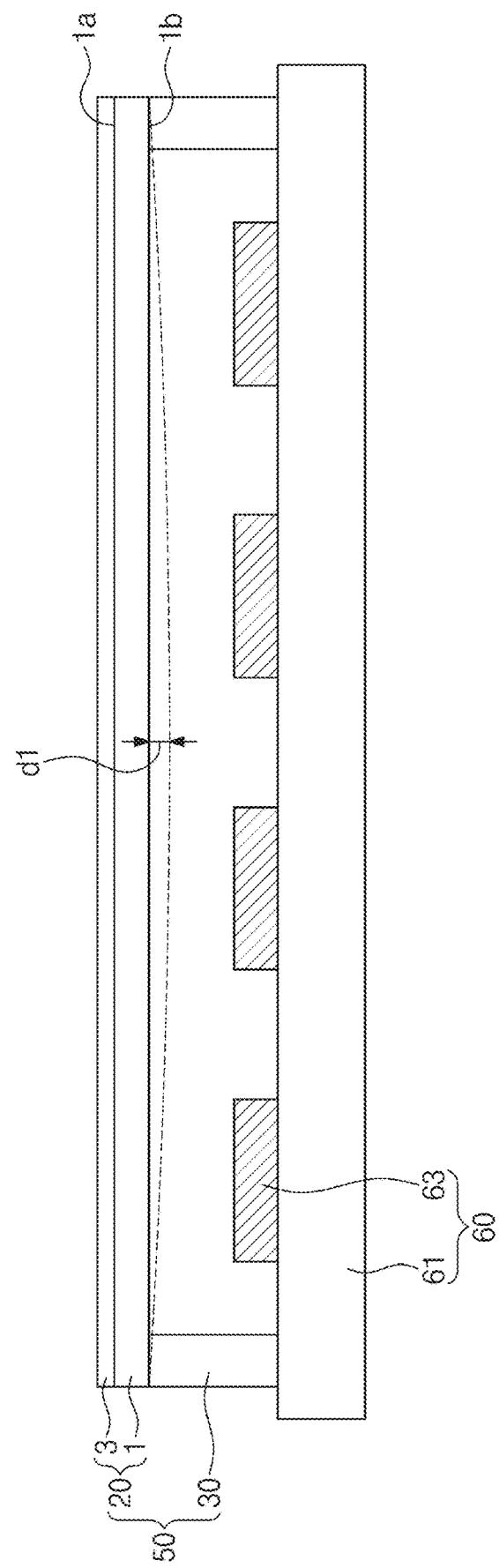
FIG. 24 illustrates a cross-sectional view showing a pellicle according to some example embodiments of inventive concepts.

FIG. 24 illustrates a cross-sectional view showing a pellicle according to some example embodiments of inventive concepts.

Referring to FIG. 24, a reticle 70 may include a photomask 60 to which, for example, the pellicle 50 of FIG. 1 is attached. The photomask 60 may include a mask substrate 61 and a mask pattern 63 on the mask substrate 61. Shape, size, and spacing of the mask pattern 63 may be merely examples and may variously be changed. The mask substrate 61 may include, for example, quartz. The mask substrate 61 may include a chromium nitride layer, a quartz layer, and/or a ruthenium capping layer. The quartz layer and the ruthenium capping layer may be provided therebetween with molybdenum layers and silicon layers that are alternately and repeatedly stacked. The mask pattern 63 may include a tantalum-based absorber and an antireflection layer on the absorber.

FIG. 24 shows that the reticle 70 includes the pellicle 50 of FIG. 1, but the reticle 70 may include, instead of the pellicle 50, any one of the pellicles 50a to 50g discussed with reference to FIGS. 15, 17 to 19, and 21 to 23.

Figure 25:
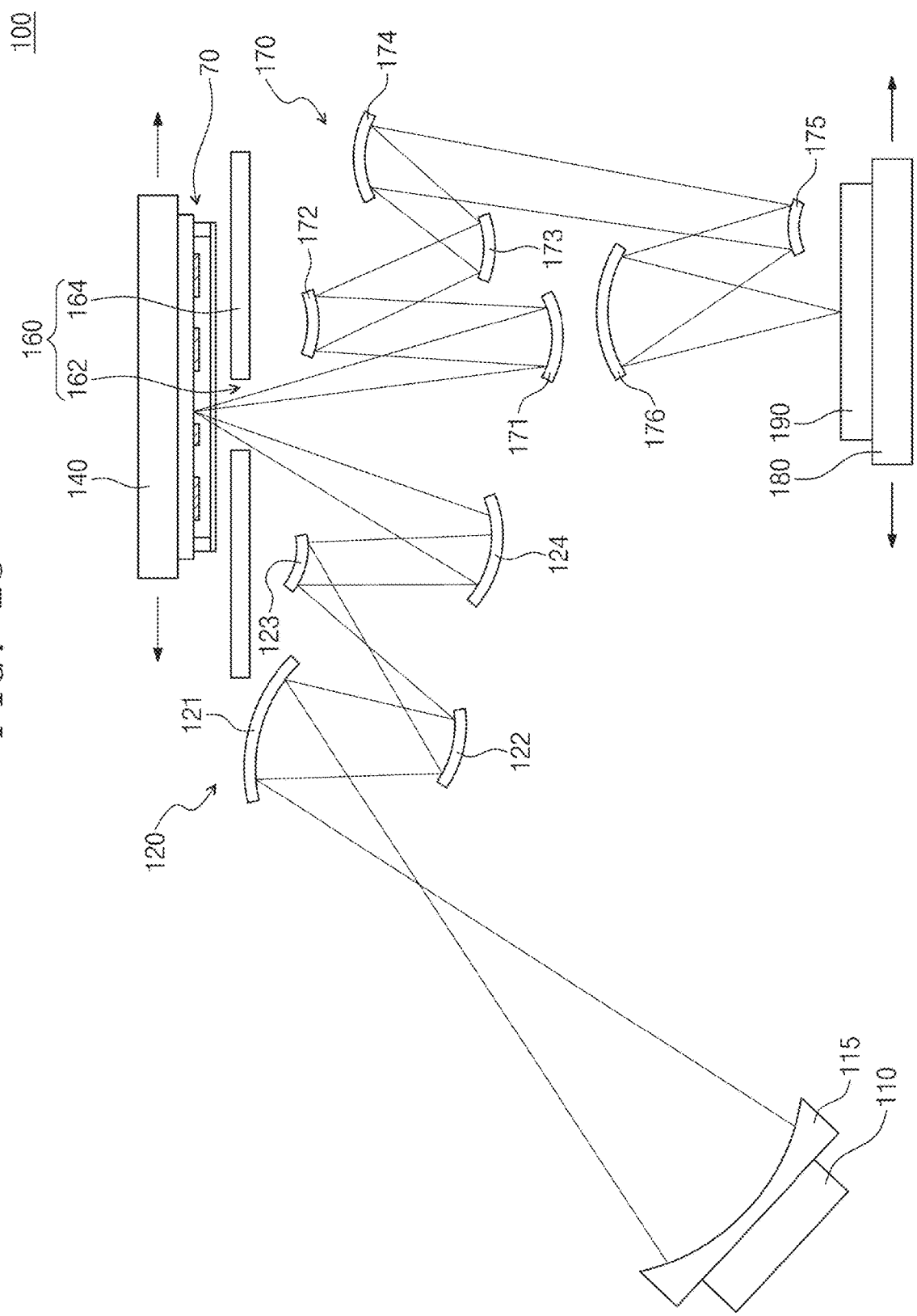
FIG. 25 illustrates a schematic diagram showing a photolithography process that uses a reticle including a pellicle according to some example embodiments of inventive concepts.

FIG. 25 illustrates a schematic diagram showing a photolithography process that uses a reticle including a pellicle according to some example embodiments of inventive concepts.

Referring to FIG. 25, according to some example embodiments of inventive concepts, a reflective photolithography process may be performed. In the reflective photolithography process, the reticle 70 having the pellicle 50 attached thereto may be downwardly loaded on a reticle stage 140 of a reflective photolithography system 100 that includes a light source 110, an illumination mirror system 120, a blinder 160, a projection mirror system 170, and a wafer stage 180 in addition to the reticle stage 140.

The light source 110 may generate extreme ultraviolet (EUV) radiation. A light whose wavelength is about 13.5 nm, for example, extreme ultraviolet (EUV) radiation, may be generated from the light source 110 using plasma that is produced when a carbon dioxide laser is irradiated onto a small amount of tin (Sn) droplets. The light source 110 may include a light collector 115. The light collector 115 may collect the EUV radiation generated from the light source 110, and may control the EUV radiation to move in a certain single direction. The EUV radiation generated from the light source 110 may pass through the light collector 115, and may then be irradiated on the illumination mirror system 120.

The illumination mirror system 120 may include a plurality of illumination mirrors 121, 122, 123, and 124. The illumination mirrors 121 to 124 may be configured to condense the EUV radiation such that the EUV radiation may be prevented or reduced in likelihood from being lost out of mirrored irradiation pathways. The illumination mirrors 121 to 124 may also be configured to control the EUV radiation to have overall uniform intensity distribution. Therefore, each of the illumination mirrors 121 to 124 may include an concave or convex mirror to variously change the pathway of the EUV radiation. The illumination mirror system 120 may shape the EUV radiation into a square-, circular-, or bar-shaped EUV radiation, which may be transferred to the reticle stage 140.

The reticle stage 140 may load the reticle 70 on a bottom surface and move in a horizontal direction. For example, the reticle stage 140 may move along an arrow direction shown in FIG. 25. The reticle stage 140 may include an electrostatic chuck (ESC). The reticle 70 may be placed on the bottom surface of the reticle stage 140 so that a mask-pattern side of the reticle 70 may face downwardly.

The blinder 160 may be under the reticle stage 140. The blinder 160 may include a slit 162 and a plate 164. The slit 162 may have an aperture shape. The slit 162 may shape the EUV radiation that is delivered from the illumination mirror system 120 to the reticle 70 on the reticle stage 140. The EUV radiation from the illumination mirror system 120 may pass through the slit 162, and may then be irradiated on the reticle 70 on the reticle stage 140. The EUV radiation reflected from the reticle 70 on the reticle stage 140 may pass through the slit 162 and travel to the projection mirror system 170. The plate 164 may block the EUV radiation that is irradiated on a region other than the slit 162. Thus, the blinder 160 may allow a portion of the EUV radiation to pass through the slit 162, and may use the plate 164 to block another portion of the EUV radiation. The slit 162 may permit passing of the EUV radiation that is reflected from the reticle 70 placed on the bottom surface of the reticle stage 140.

The projection mirror system 170 may receive the EUV radiation that has been reflected from the reticle 70 and passed through the slit 162, and may transmit the EUV radiation to a wafer 190 on the wafer stage 180. The projection mirror system 170 may include a plurality of projection mirrors 171, 172, 173, 174, 175, and 176. The EUV radiation, which is incident on the wafer 190 by the projection mirrors 171 to 176, may have information about virtual aerial images of optical patterns on the reticle 70. The EUV radiation irradiated on the wafer 190 may keep its shape that is formed when passing through the slit 162. The plurality of projection mirrors 171 to 176 may correct various aberrations.

The wafer stage 180 may accommodate the wafer 190 and move in the horizontal direction. For example, the wafer stage 180 may move along an arrow direction shown in FIG. 25. The wafer stage 180 may move simultaneously with the reticle stage 140 in the same direction at a constant rate. For example, the wafer stage 180 may move in a step-and-scan manner. The EUV radiation irradiated from the projection mirror system 170 may have a focus that is located on a surface of the wafer 190. For example, the wafer 190 may be provided thereon with a photoresist layer having a predetermined thickness, and the focus of the EUV radiation may be positioned inside the photoresist layer.

Referring to FIGS. 24 and 25, the pellicle 50 may protect the photomask 60 from contamination caused by particles during the photolithography process, and the formation of photoresist patterns may not be affected even when the pellicle 50 is stained on its surface with foreign substances by which the EUV radiation is out of focus.

When the photolithography process continues, the pellicle membrane 20 may change in pressure and temperature. The pellicle membrane 20 may partially bulge downwardly due to a variation in volume thereof. A distance d1, e.g. a maximal distance between a normally flat bottom surface of the pellicle membrane 20 and a maximally bulged bottom surface of the pellicle membrane, 20 may be less than or equal to, for example, about 500 μm.

During the photolithography process, a hydrogen gas may be supplied to remove defects (e.g., photoresist residues) adhered to surfaces of the mirrors 121 to 124 and 171 to 176. In case that the pellicle membrane 20 includes no recovery layer 3, the pellicle membrane 20 may suffer from damage caused when hydrogen atoms are bonded to the dangling bonds DB in the pinhole 1r. In some example embodiments of inventive concepts, because the pellicle membrane 20 includes the recovery layer 3 that fills the pinhole 1r, the pellicle membrane 20 may be free of, or reduced in, damage.

In FIG. 25, the pathways of the EUV radiation are conceptually illustrated to aid in clearly understanding inventive concepts.

According to some example embodiments of inventive concepts, a pellicle for a photomask may include a recovery layer to cure or reduce the impact of defects, such as pinhole or cavity, possibly present on a base layer. The recovery layer may fill the pinhole or cavity such that it may be possible to prevent or reduce the likelihood of the occurrence of dangling bonds in the pinhole or cavity. The pellicle may then be prevented or reduced in likelihood of occurrence from damage due to hydrogen atoms during a photolithography process, and accordingly the photolithography process may be more reliably performed and the pellicle may increase in lifespan or durability.

Furthermore, as in the base layer, the recovery layer may include a carbon-containing layer and therefore have similar optical, physical, and chemical characteristics to those of the base layer.

In a method of fabricating a pellicle for a photomask, catecholamine may be used to form the recovery layer, which catecholamine is easily coated on the base layer, with little to no effort fills the pinhole or cavity, and is combined with the base layer to form aromatic rings. The pellicle for a photomask may increase surface uniformity of a pellicle membrane and have improved or superior optical characteristics, durability, and mechanical strength.

Although the present invention has been described in connection with the embodiments of the present invention illustrated in the accompanying drawings, it will be understood to those of ordinary skill in the art that various changes and modifications may be made without departing from the technical spirit and essential feature of the present invention. It therefore will be understood that the embodiments described above are just illustrative but not limitative in all aspects.

What is claimed is:

1. A method of fabricating a pellicle for a photomask, the method comprising:
   providing a pellicle membrane; and
   transcribing the pellicle membrane onto a frame,
   wherein providing the pellicle membrane includes,
   forming a base layer having a first surface and a second surface facing the first surface,
   coating a first carbon-containing material on the first surface of the base layer, and
   performing a first heat treatment process at a first process temperature to form a first recovery layer that is bonded to the base layer,
   wherein the first carbon-containing material includes a catecholamine.

2. The method of claim 1, wherein providing the pellicle membrane further includes:
   forming a support layer;
   providing the support layer on the second surface of the base layer; and
   performing a second heat treatment process at a second process temperature to bond the support layer to the base layer.

3. The method of claim 2, wherein
   the first process temperature is between 900 and 2,000° C., and
   the second process temperature is between 100 and 300° C.

4. The method of claim 1, wherein
   the base layer includes one of graphene, graphite, or both graphene and graphite, and
   a content of SP3 covalent bonds between carbon atoms contained in the first recovery layer greater than a content of SP3 covalent bonds between carbon atoms contained in the base layer.

5. The method of claim 1, wherein forming the base layer includes providing vapor of a second carbon-containing material to deposit carbon atoms on a catalytic metal substrate.

6. The method of claim 1, wherein the base layer includes a first pinhole on the first surface,
   wherein coating the first carbon-containing material includes filling the first pinhole with the first carbon-containing material.

7. The method of claim 6, wherein the base layer further includes a second pinhole on the second surface,
   wherein providing the pellicle membrane further includes,
   coating a third carbon-containing material on the second surface of the base layer to fill the second pinhole with the third carbon-containing material, and
   performing a heat treatment process to form a second recovery layer bonded to the base layer,
   wherein the third carbon-containing material includes a catecholamine.

* * * * *